United States Patent
Mahendra et al.

(10) Patent No.: US 12,035,505 B2
(45) Date of Patent: Jul. 9, 2024

(54) SYSTEM AND METHOD FOR COMPUTE SYSTEM COOLING FAN CONTROL

(71) Applicant: HEWLETT PACKARD ENTERPRISE DEVELOPMENT LP, Houston, TX (US)

(72) Inventors: Pranay Mahendra, Houston, TX (US); Arthur Volkmann, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 185 days.

(21) Appl. No.: 17/503,840

(22) Filed: Oct. 18, 2021

(65) Prior Publication Data
US 2023/0121710 A1    Apr. 20, 2023

(51) Int. Cl.
| G05D 23/19 | (2006.01) |
| G06F 1/20 | (2006.01) |
| G06F 1/28 | (2006.01) |
| H05K 7/20 | (2006.01) |

(52) U.S. Cl.
CPC ..... *H05K 7/20209* (2013.01); *G05D 23/1931* (2013.01); *G06F 1/206* (2013.01); *G06F 1/28* (2013.01); *H05K 7/20736* (2013.01); *H05K 7/20836* (2013.01)

(58) Field of Classification Search
CPC ........... H05K 7/20209; H05K 7/20736; H05K 7/20836; G05D 23/1931; G06F 1/206; G06F 1/28; G06F 1/3215; G06F 1/325; Y02D 10/00
See application file for complete search history.

(56) References Cited

U.S. PATENT DOCUMENTS

| 7,430,672 B2* | 9/2008 | Rotem | G06F 1/3296 |
| | | | 713/300 |
| 7,533,003 B2* | 5/2009 | Floyd | G06F 11/348 |
| | | | 702/186 |
| 7,644,051 B1* | 1/2010 | Moore | G05B 13/048 |
| | | | 706/903 |
| 7,689,839 B2* | 3/2010 | Uguen | G06F 1/3287 |
| | | | 713/300 |
| 7,904,287 B2* | 3/2011 | Lefurgy | G06F 11/3476 |
| | | | 703/21 |
| 7,917,772 B1* | 3/2011 | Koniaris | G06F 1/3203 |
| | | | 713/300 |
| 7,971,073 B2* | 6/2011 | Hsu | G06F 1/3215 |
| | | | 713/340 |
| 8,463,456 B2* | 6/2013 | Carter | G05D 23/1919 |
| | | | 700/3 |

(Continued)

*Primary Examiner* — Jason Lin
(74) *Attorney, Agent, or Firm* — Nolte Lackenbach Siegel

(57) ABSTRACT

A micro control unit ("MCU") controls operation of a cooling fan in a compute device. The MCU is responsive to determining that a fan speed of the cooling fan is above a predetermined speed threshold to periodically determine power consumption of the cooling fan. In response to a periodic determination of power consumption exceeding a predetermined power consumption limit, the MCU reduces the fan speed of the cooling fan by a predetermined increment and continues periodically determine power consumption of the cooling fan. Upon determining that the power consumption does not exceed the predetermined power consumption limit, the MCU discontinues any prior reduction of the fan speed.

20 Claims, 10 Drawing Sheets

(56) References Cited

U.S. PATENT DOCUMENTS

| | | | |
|---|---|---|---|
| 8,565,933 B2* | 10/2013 | Nielsen | H05K 7/20209 700/275 |
| 8,838,286 B2 | 9/2014 | Florez-Larrahondo et al. | |
| 8,995,670 B2 | 3/2015 | Lambert et al. | |
| 9,141,156 B2 | 9/2015 | Ross et al. | |
| 9,382,915 B2* | 7/2016 | Hsu | F04D 27/004 |
| 9,494,954 B2 | 11/2016 | Artman et al. | |
| 9,507,644 B2* | 11/2016 | Hsiao | G06F 9/5094 |
| 9,785,208 B2 | 10/2017 | Lovicott et al. | |
| 9,870,037 B2 | 1/2018 | Jenne et al. | |
| 10,078,610 B2 | 9/2018 | Ragupathi et al. | |
| 10,222,842 B2 | 3/2019 | Ross et al. | |
| 10,257,959 B2* | 4/2019 | Warren | H05K 7/20172 |
| 10,405,461 B2 | 9/2019 | Shabbir et al. | |
| 2002/0140389 A1* | 10/2002 | Ohki | G06F 1/206 318/471 |
| 2005/0211426 A1* | 9/2005 | Ziarnik | G05D 23/26 165/287 |
| 2005/0273208 A1* | 12/2005 | Yazawa | H01L 23/4735 257/E23.099 |
| 2006/0176186 A1* | 8/2006 | Larson | H02H 7/08 324/177 |
| 2006/0178764 A1* | 8/2006 | Bieswanger | G06F 1/206 700/89 |
| 2008/0234953 A1* | 9/2008 | Ignowski | G06F 1/26 702/60 |
| 2008/0306704 A1* | 12/2008 | Rockenfeller | G06F 1/206 702/132 |
| 2009/0296342 A1* | 12/2009 | Matteson | G06F 1/206 361/679.46 |
| 2010/0049995 A1* | 2/2010 | Casey | G06F 1/206 713/300 |
| 2011/0231030 A1* | 9/2011 | Carter | G06F 1/324 713/320 |
| 2012/0131363 A1* | 5/2012 | Hsu | G05D 23/19 713/320 |
| 2013/0197895 A1 | 8/2013 | Wang et al. | |
| 2014/0100709 A1* | 4/2014 | Sakurai | H05K 7/20836 700/300 |
| 2021/0303059 A1* | 9/2021 | Wang | G06F 1/28 |

\* cited by examiner

SYSTEM AND METHOD FOR COMPUTE SYSTEM COOLING FAN CONTROL

BACKGROUND

Compute systems, such as rack-mounted compute systems found in datacenters, may include one or more cooling fans to maintain thermal conditions of the system components. Substantial power may be consumed to operate cooling fans and achieve proper thermal regulation. Fan speeds may be modulated according to dynamic system requirements and thermal conditions.

BRIEF DESCRIPTION OF THE DRAWINGS

The present disclosure is best understood from the following detailed description when read with the accompanying figures, wherein.

Figure 1:
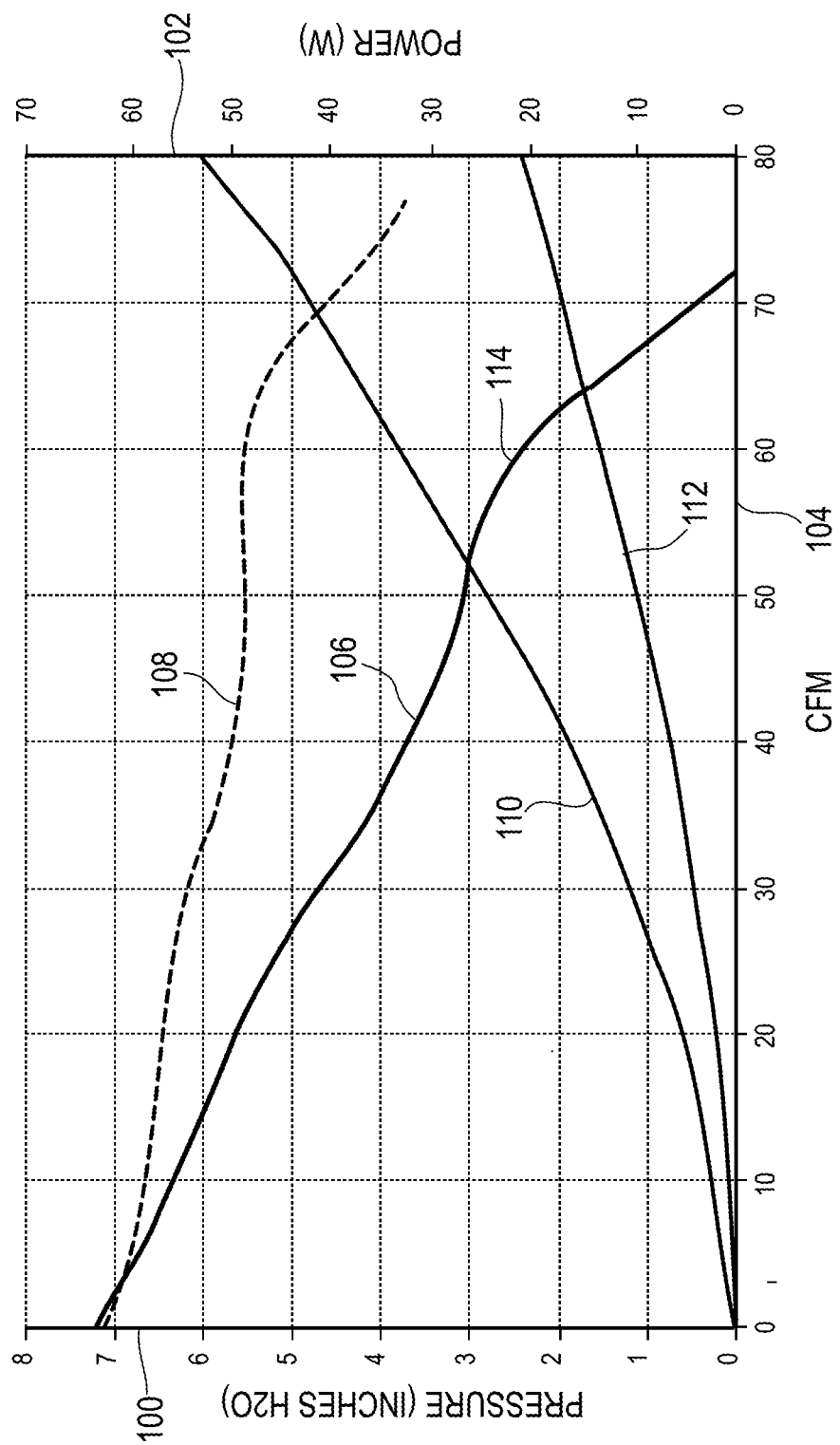
FIG. 1 is a plot of fan performance versus pressure and power determinants for a prior art cooling fan.

It is emphasized that, in accordance with the standard practice in the industry, various features are not drawn to scale. In fact, the dimensions of the various features may be arbitrarily increased or reduced for clarity of discussion or illustration.

DETAILED DESCRIPTION

Illustrative examples of the subject matter claimed below are disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

As used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

As used herein, to "provide" an item means to have possession of and/or control over the item. This may include, for example, forming (or assembling) some or all of the item from its constituent materials and/or, obtaining possession of and/or control over an already-formed item.

In compute systems, the power supplied to one or more cooling fans plays a role in defining the overall performance of the fan across the defined pressure-airflow (or, "PQ" range) for the compute system. Fan power consumption may be higher under higher operating pressure (or, "back pressure") and lower when approaching free-air operation. Higher operating pressure may exist depending upon the configuration of a compute system, including the size of the compute system enclosure, and the number and types of components that are installed in the enclosure.

In examples disclosed herein, fan performance in compute systems may be improved by capping the fan power at defined threshold values outside of system operating ranges, i.e., operational ranges not encountered by the fan when operating in the compute system. In some examples, fan power may be capped by comparing the operational fan power to a defined power limit within the fan when it is outside of the system operational range, allowing for an increase in the total airflow through the compute system within the operating range.

FIG. 1 is a plot of cooling fan performance versus operating pressure and fan power for a prior art compute system cooling fan (not shown). The example cooling fan of FIG. 1 is a 60-by 60-by 38-millimeter (mm) fan with a 50-watt operating range.

In FIG. 1, a left-hand Y-axis 100 reflects a first fan performance determinant, namely fan pressure, which may be measured in units of inches of water ("inches H2O"), and a right-hand Y-axis 102 reflects a second fan performance determinant, namely fan power, which may be measured in watts (W). The X-axis 104 in FIG. 1 reflects fan performance, which may be measured in cubic feet per minute ("CFM") of air moved. Fan performance over an operating range may be affected by the pressure and power determinants of Y-axes 100 and 102, respectively.

With continued reference to FIG. 1, curve 106 is a fan curve reflecting operation of a cooling fan, and curve 108 is a power rating curve for a cooling fan in this example. Power rating curve 108 in FIG. 1 reflects a fan which is rated at a maximum power of approximately 62 W, since where fan curve 106 intersects left-hand (pressure) Y-axis 100 at a point reflecting approximately 7 inches H2O, power rating curve 108 shows that the fan is rated to draw approximately 62 W of power, as reflected on right-hand Y-axis 102. At the other extreme, where fan curve 106 meets X-axis 104 (CFM), the fan is subjected to minimum operating pressure (zero inches H2O) and is outputting a maximum of approximately 72 CFM. At this point, as reflected by power rating curve 108, the fan is rated draw a minimum amount of power across it rated range, approximately 35 W in the example of FIG. 1.

In FIG. 1, a first air impedance (i.e., operating pressure) curve 110 reflects a maximum air impedance for the compute system in the example of FIG. 1, and a second air impedance curve 112 reflects a minimum air impedance. Air impedance curves 110 and 112 in FIG. 1 reflect the resistance to air flow in a given implementation of a compute system, according to its configuration, i.e., the type of enclosure, the types and numbers of components installed in the enclosure.

Operating range segment 114 of fan curve 106, i.e., the segment 114 between high air impedance curve 110 and low air impedance curve 112, reflects the normal operating range of a fan in a compute system, ranging from a compute system configured to exhibit maximum air impedance (curve 110) to a compute system configured to exhibit a minimum air impedance (curve 112). FIG. 1 shows that operating range segment 114 falls within only a limited portion of the overall rated operation of a fan (power rating curve 108). That is, the operational rating of a fan at points outside of operating range segment 114 are not of concern in the context of implementation within a compute system having high and low air impedance characteristics represented by air impedance curves 110 and 112 in FIG. 1. FIG. 1 also shows that within the operating range corresponding to operating range segment 114, the fan (in this example rated at a maximum of 62 W) draws only approximately 50 watts, as reflected by power rating curve 108 in the region corresponding to operating range segment 114.

However, FIG. 1 shows that to achieve desired fan performance corresponding to operating range segment 114 of fan curve 108, as shown in FIG. 1, a fan having a maximum rating of 62 W is required, as reflected by power rating curve 108. In some examples, a lesser maximum power constraint may be imposed upon a compute system fan, such that a fan having a lower power rating, e.g., 50 W, may be utilized. This may result in lesser operating performance being realized within the operating range. This is illustrated in FIG. 2, in which elements which are identical to those of FIG. 1 retain identical reference numerals.

Figure 2:
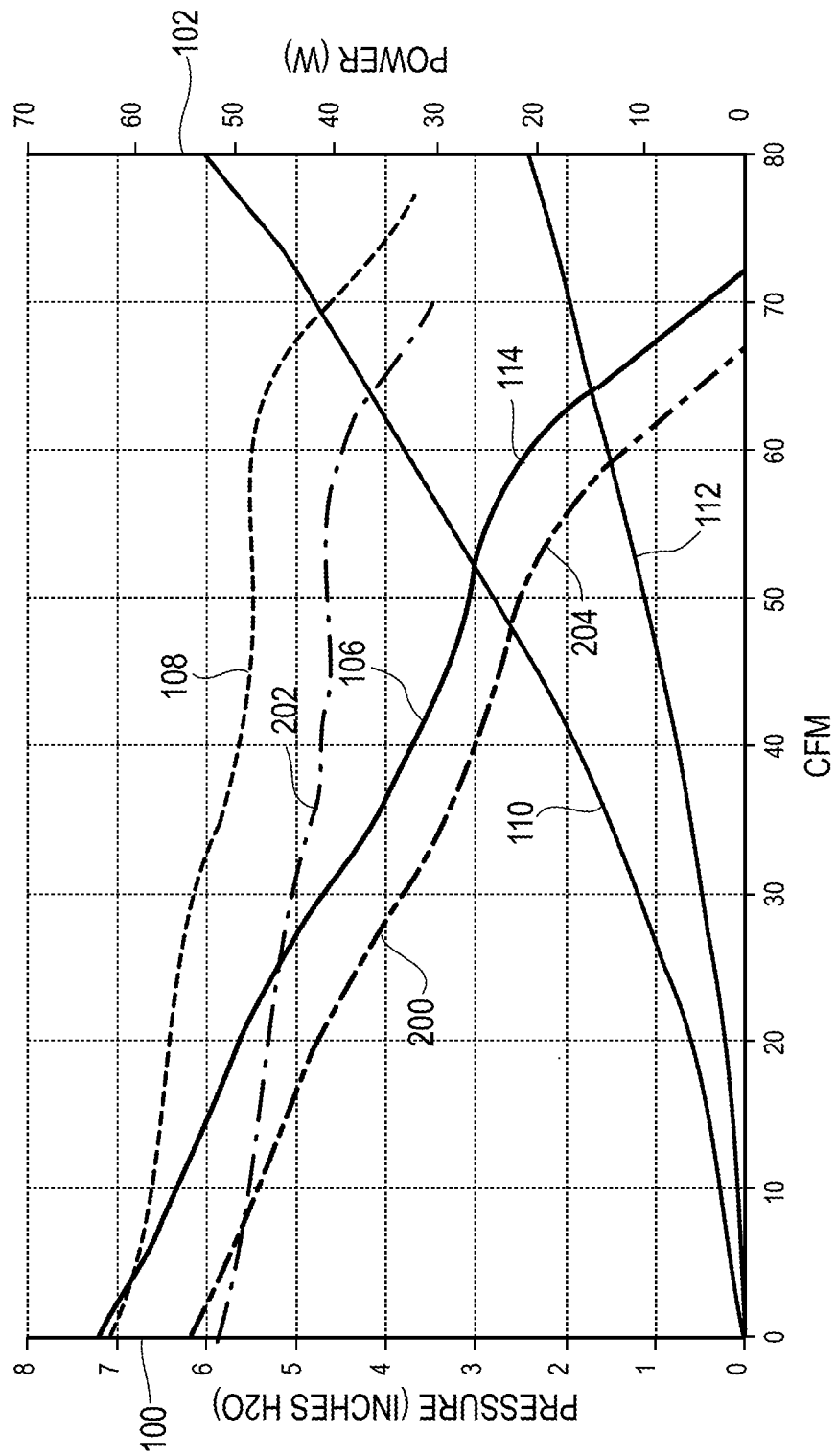
FIG. 2 is a plot of fan performance versus pressure and power determinants for the prior art cooling fan of FIG. 1 compared with fan performance with an imposed power cap.

In particular, referring to FIG. 2, there is shown an example in which performance of the prior art fan from FIG. 1, rated to draw a maximum of 62 W of power, in comparison to operation of that fan when power is capped at 50 W. In FIG. 2, a capped fan curve 200 is shown, representing capped performance of the fan, as reflected by a capped power rating curve 202. As shown in FIG. 2, with the capped fan curve 200, the operating range segment 204 of the fan between high impedance curve 110 and low impedance curve 112 reflects reduced fan performance relative to operating range segment 114 of the uncapped 62 W rated fan.

Figure 3:
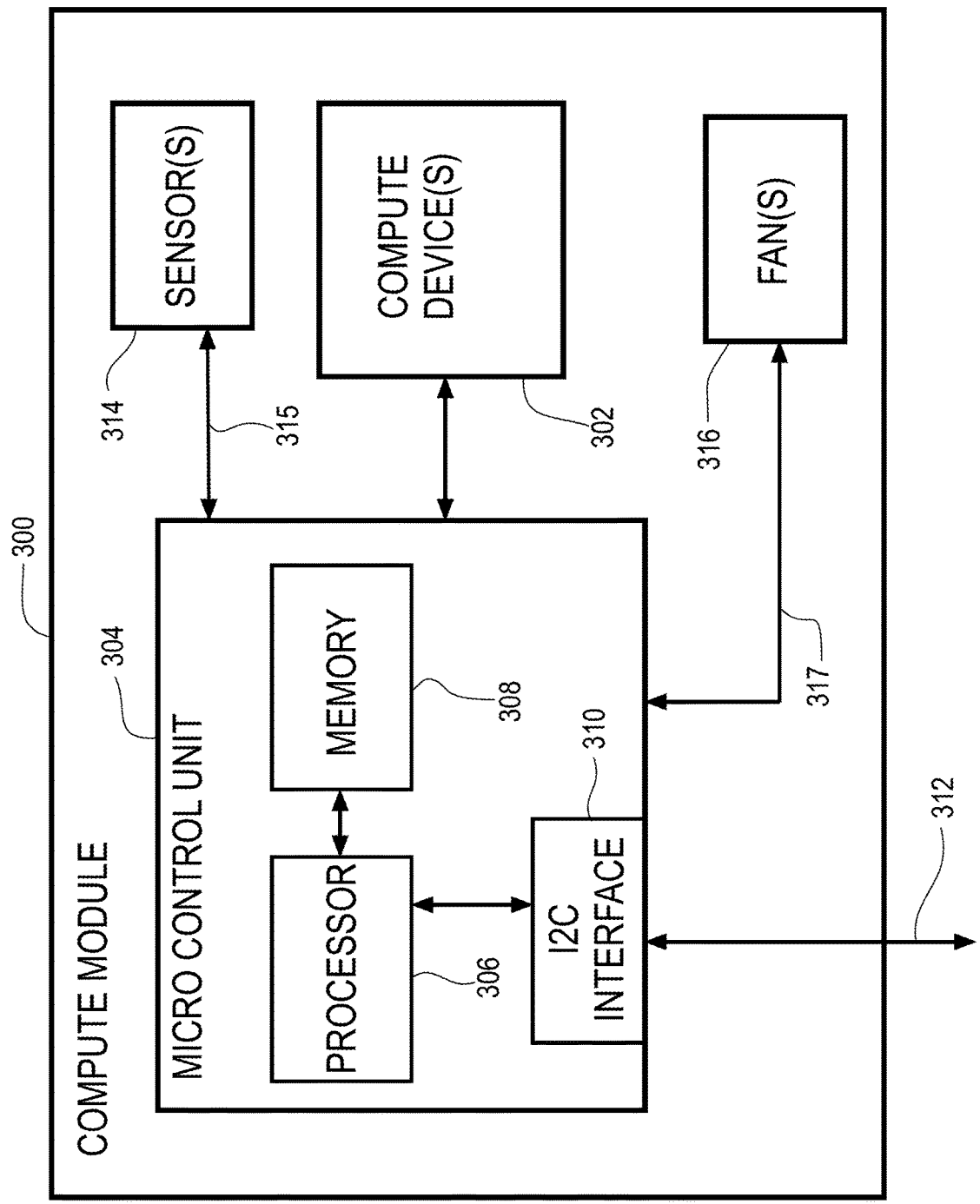
FIG. 3 is a block diagram of a compute device according to one or more examples.

FIG. 3 is a block diagram illustrating certain components of a compute device 300 according to one or more embodiments of the invention. Compute device 300 may be, in one or more examples, a rack mounted or "blade" type compute device configured to be housed within an enclosure or rack (not shown) which may contain multiple such compute devices. As used herein, the term compute device will be understood to generally refer to various types of computing equipment, including without limitation, processing devices, memory devices, hard drives, switches, routers, or any combination thereof.

As shown in FIG. 3, compute device 300 may include one or more compute devices 302, which as noted above, may be, without limitation, one or more processing devices, memory devices, hard drives, switches, routers, or any combination thereof. In examples, compute device 300 may further include a micro control unit ("MCU") 304 for controlling and/or coordinating operation of compute device 300 and the one or more compute devices 302 contained therein. MCU 304 may include a processor 306, which may be, without limitation, a microprocessor, microcontroller, application-specific integrated circuit ("ASIC"), or a dedicated programmed logic circuit. Processor 306 may be coupled to a memory 308 for storing, data and/or programming instructions executable by processor 306 to control operation of processor 306. In some examples the memory 308 may be omitted. For instance, in examples in which the processor 306 is an ASIC or a dedicated programmed logic circuit the memory 308 may be omitted.

MCU 304 may further optionally include and inter-integrated circuit ("I2C") interface for connecting MCU 304 to an external control bus 312 for intra-system communication with other compute devices, such as, for example, other compute devices in the enclosure housing compute device 300 of the present example.

With continued reference to FIG. 3, compute device 300 may include one or more sensors 314 electrically coupled to MCU 304 by a link 315 for monitoring operational parameters of compute device 300. For example, the one or more sensors 314 may include temperature sensors for providing MCU 304 with thermal readings during operation of compute devices 302. In examples, link 315 may be a Platform Environment Control Interface (PECI) connection or another data path. The one or more sensors may include on-die digital thermal sensors incorporated into compute devices 302, or may be externally located.

Further, compute device 300 may include one or more fans 316 for providing air circulation through 300 to dissipate heat generated by compute devices 302 during operation. Fan(s) 316 may be coupled to MCU 304 via a link 317 for enabling fan(s) 316 to communicate speed information to MCU 304 and for MCU 304 to communicate speed control commands to fan(s) 316. In examples, link 317 may be a PECI connection or another data path.

In various examples, MCU 304 may control operation of the one or more fans 316, so as to, for example, control the speed(s) of the one or more fan(s) 316 depending upon thermal demands. That is, in some examples, thermal data provided to MCU 304 from sensor(s) 314, as well as operational data provided to MCU 304 from compute device(s) 302, may indicate a degree of demand for thermal dissipation, and MCU may then control operation of fan(s) 316 according to that demand. For example, in periods of low thermal demand, MCU 304 may reduce the speed(s) of the one or more fans 316, thereby decreasing power utilization of compute device 300, whereas if thermal demands increase, MCU 304 may increase the speed(s) of the one or more fans 316 to ensure that thermal conditions are kept within desired limits to avoid degraded performance of compute device(s) 302.

Note that, although the fans 316 are shown as a part of the compute device 300 in FIG. 3, this is not required. Some examples may employ a compute device such as the compute device 300 to control fans located elsewhere in the compute system in which the compute device is mounted. Other examples may use a compute device to control fans that are a part of the compute device as well as fans located elsewhere other than the compute device.

Figure 4:
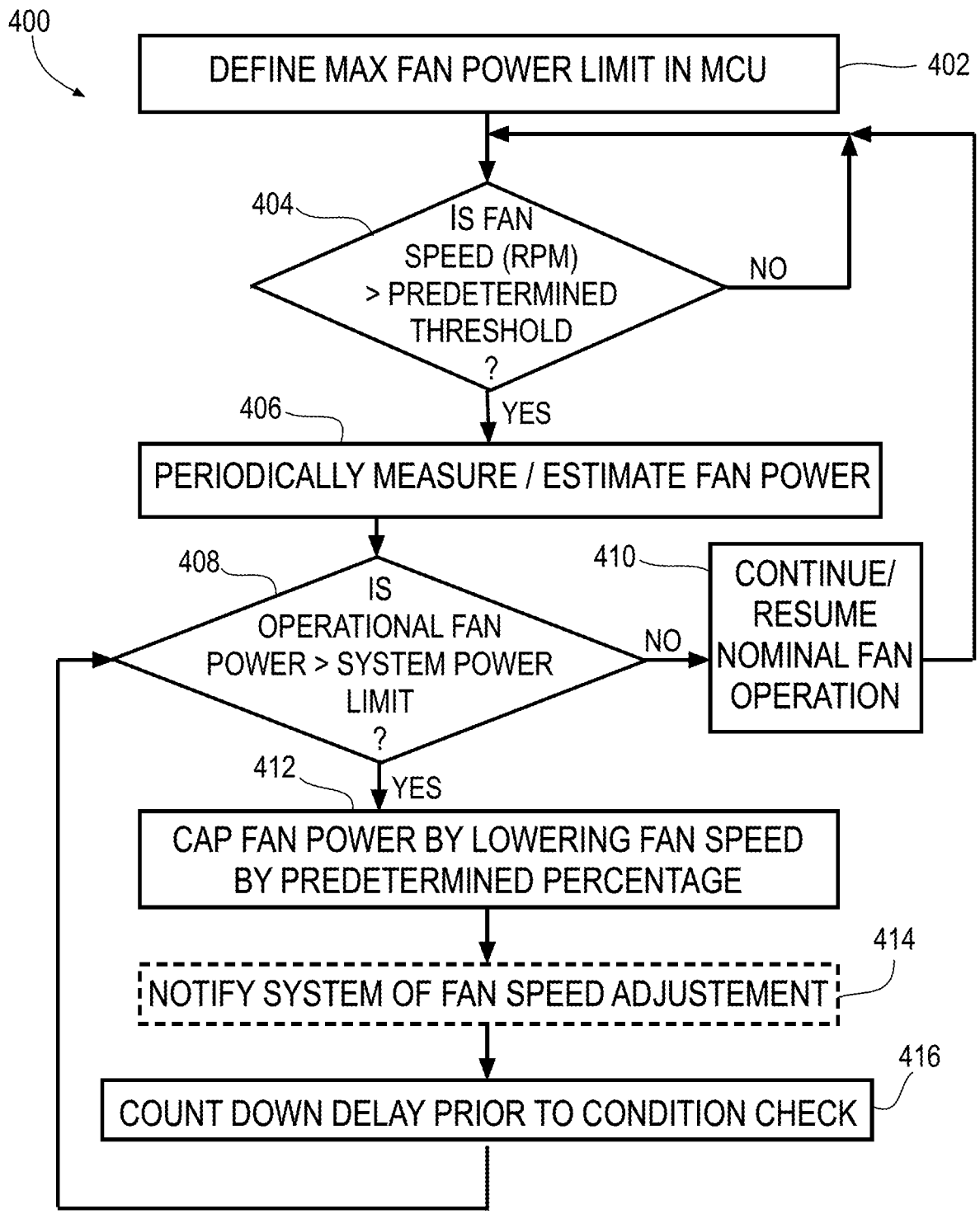
FIG. 4 is a flow diagram of a method of operating a cooling fan according to one or more examples.

Turning to FIG. 4, there is shown a flow diagram of a method 400 for controlling operation of a cooling fan according to one or more examples. In the example of FIG. 4, the cooling fan may be a cooling fan installed in a compute system such as compute device 300 described above with reference to FIG. 3.

In block 402, an MCU, such as MCU 304 in FIG. 3, determines a fan power limit. This determination in block 402 may be based upon identification of the fan and its power rating (such as the 62 W and 50 W fans described with reference to FIG. 2), or based upon other system constraints. A power rating may be assigned to a particular fan either by the manufacturer and/or by a third party certification entity such as Underwriters Laboratories (UL LLC®). The fan power limit determined in block 402 may be equal to or less than the power rating assigned to a particular fan by a manufacturer or a third-party certification entity. The fan power limit determined in block 402 may be further constrained by fan power capacities of the compute system itself, i.e., the compute system may have a fan power capacity less than less than the power rating assigned to a particular fan by a manufacturer or a third-party certification entity In decision block 404, the MCU determines whether the fan is operating at a speed exceeding a predetermined threshold. In one example, this threshold may be eighty percent (80%) of its maximum speed, although other thresholds may be applied in decision block 404 in alternative implementations. If the MCU determines that the fan is operating at a speed does not exceed the predetermined threshold, this process continues without any action being taken by the MCU.

On the other hand, if in decision block 404 the MCU determines that the fan is operating at a speed exceeding the predetermined threshold, then the MCU begins, in block 406, to periodically determine the power supplied to the fan. This determination of power supplied to the fan may be accomplished either by estimation or measurement. Power estimation may be based upon calculating a power value based upon fan speed information provided to the MCU by the fan and known characteristics of the fan or compute system, such as chassis/system air flow impedance, temperature differentials between air inlet and air outlet, and thermal characteristics of components installed in the compute system. Measurement may be accomplished with dedicated circuitry in the MCU or in a power supply providing power to the fan.

In one example, an MCU may compute the relationship between fan speed and fan power according to the following Table 1:

| FAN SPEED (%) | POWER (W) | POWER REDUCTION FROM FULL SPEED (%) |
| --- | --- | --- |
| 100 | 50 | 0 |
| 90 | 36.45 | 27 |
| 80 | 25.6 | 49 |
| 70 | 17.15 | 66 |
| 60 | 10.8 | 78 |
| 50 | 6.25 | 88 |
| 40 | 3.2 | 94 |

Based on the measurement or estimation of fan power, in decision block 408, the MCU determines whether the operational fan power exceeds a power limit defined for the system. This system power limit may be, for example, the rated power limit of the fan, or some margin below the rated power limit of the fan, e.g., 45 W for a fan rated at 50 W. If the operational power is not exceeding the system power limit, in block 410, the MCU continues or resume nominal fan operation, and the process flow will return to decision block 404 for a further determination whether the fan speed is exceeding a predetermined threshold. In the case, in block 410, where the operational fan power is not exceeding the system power limit and the MCU had previously reduced the fan speed, as discussed below with reference to block 412, then resumption of nominal operation may involve the MCU discontinuing any reduction of fan speed.

On the other hand, in decision block 408 if the operational fan power is exceeding a system power limit, then in block 412, the fan power is capped by reducing the fan speed by a predetermined increment. In some examples, this increment may be a percentage of fan speed, e.g., ten percent (10%).

Next, in an optional step represented by dashed block 414, MCU may communicate via its I2C interface (such as I2C interface 310 in the example of FIG. 3) to update a system integrated management log maintained by a system management module (not shown in the Figures) with an indication that the adjustment in block 412 was made. Other system management components may collect this information to determine that airflow for the fan may be impeded due to blockage.

Next, in block 416, MCU will initiate a countdown timer prior to taking any further action with respect to the fan. For example, MCU may wait ten seconds prior to taking any further action.

Upon expiration of the countdown timer in block 416, a determination is once again made in decision block 408 whether the operational fan power exceeds a system power limit for the fan, and if so, in block 412, fan speed is reduced by an additional increment, e.g., an additional ten percent (10%). On the other hand, in the event that the condition has cleared and the operational fan power does not exceed the system power limit in decision block 408, then in block 410, nominal fan operation is continued or resumed by the MCU by discontinuing any prior reduction of fan speed, and process flow returns to decision block 404.

Figure 5:
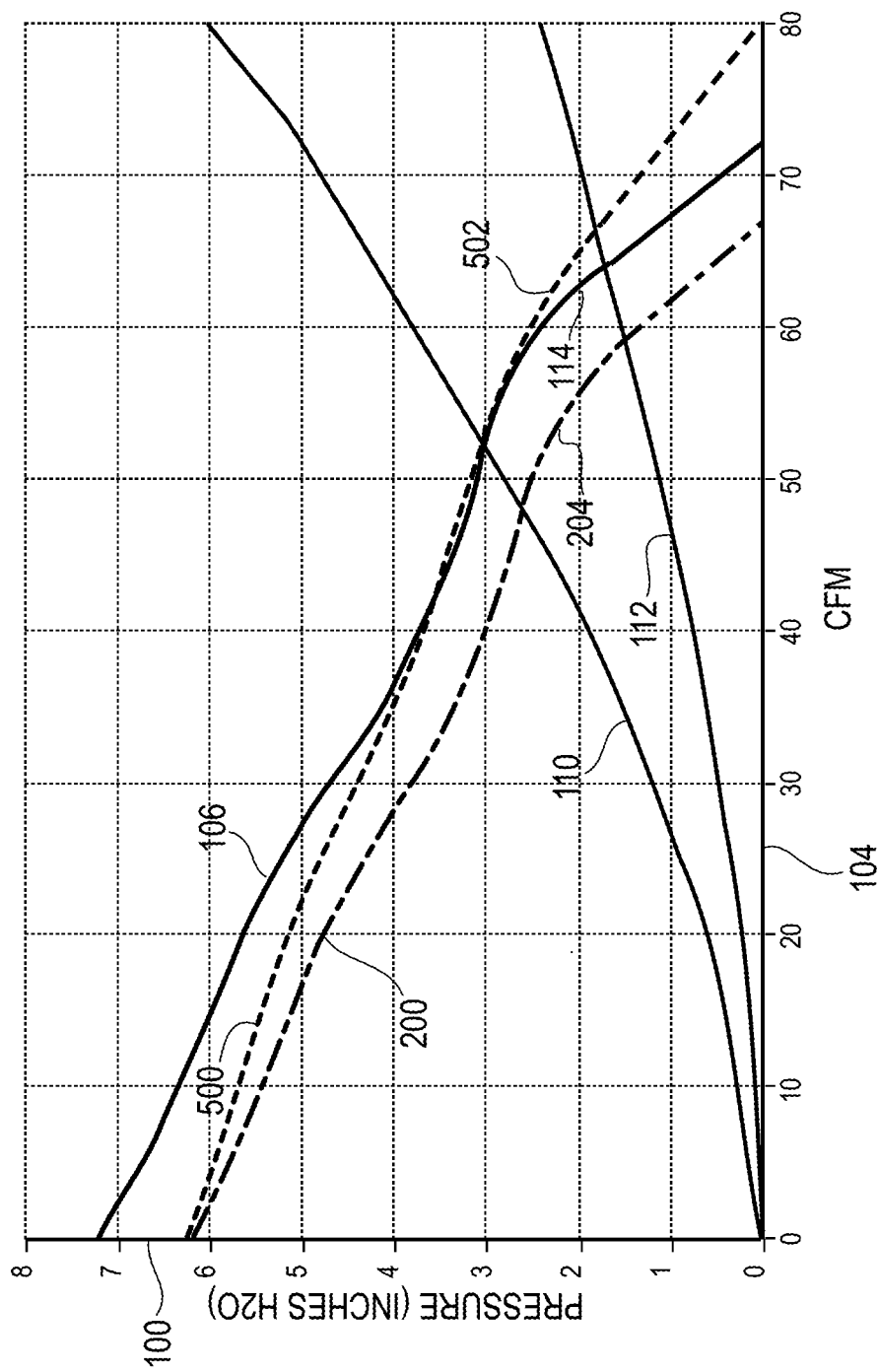
FIG. 5 is a plot of fan performance versus pressure and power for a comparing fan performance with an imposed power cap, without an imposed power cap, and when employing the method of FIG. 4.

FIG. 5 is a plot of cooling fan performance versus operating pressure and fan power illustrating a comparison between the example 62 W rated fan and 50 W rated fan described with reference to FIGS. 1 and 2, and a 50 W fan operated according to the method described in the example of FIG. 4. Elements of FIG. 5 that are identical to those of FIGS. 1 and 2 retain identical reference numerals.

In FIG. 5, curve 500 is a fan curve representing performance of a 50 W fan operated according to the method of FIG. 4. The operating range segment 502 of fan curve 500, i.e., the portion of fan curve 500 extending between high air impedance curve 110 and low air impedance curve 112, reflects performance exceeding or equal to performance of a 62 W rated fan. FIG. 5 shows that fan curve 500 for a fan operated according to the method 400 of FIG. 4 exceeds the performance of a prior art 50 W rated fan throughout the entire range of CFM performance.

Figure 6:
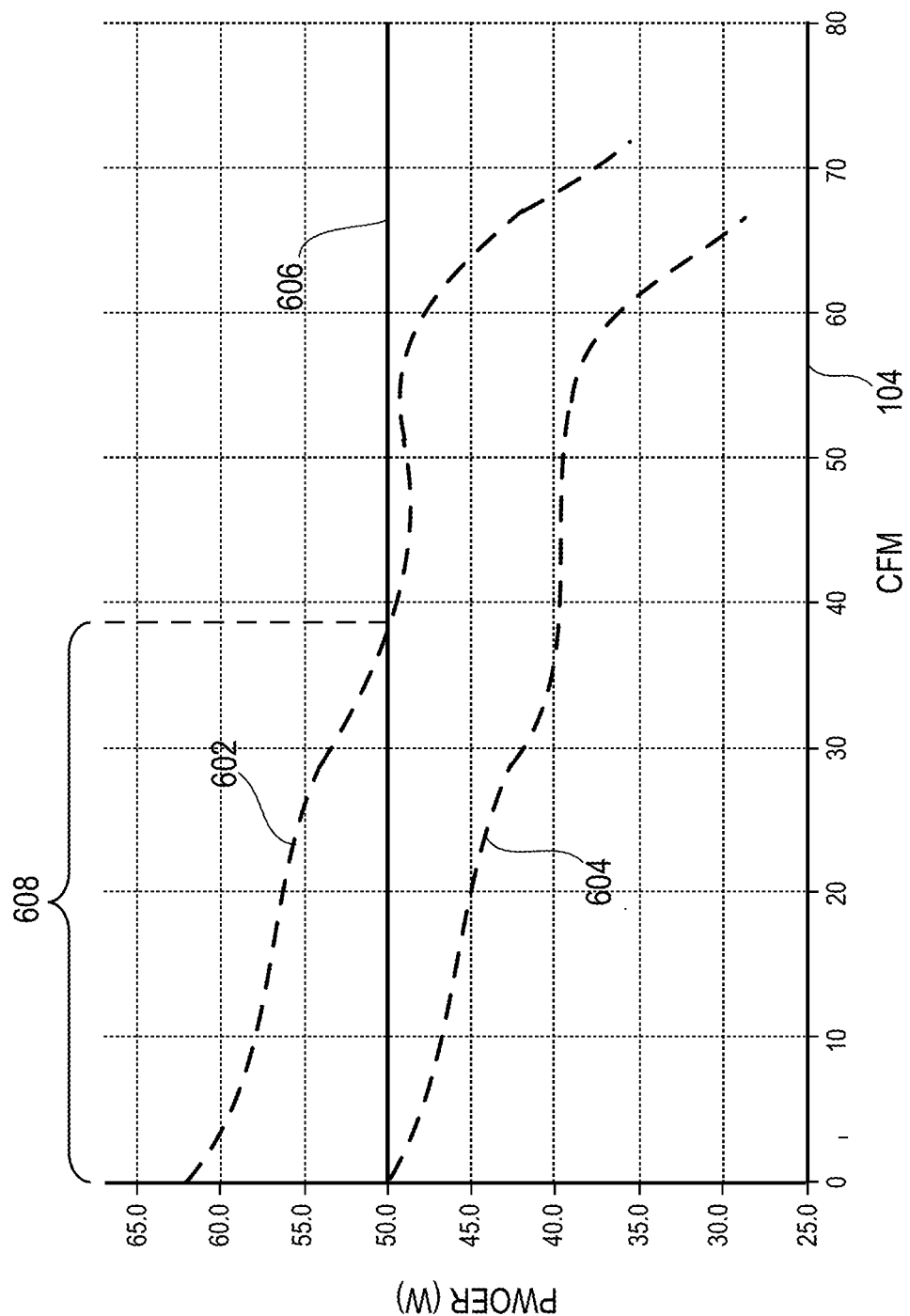
FIG. 6 is a plot of power consumption for a cooling fan comparing power consumption with an imposed power cap, without an imposed power cap, and when employing the method of FIG. 4.

FIG. 6 is a plot of power consumption of a 62 W rated fan comparing its uncapped power consumption (curve 602 in FIG. 6) with its power consumption when a 50 W power consumption is imposed (curve 604 in FIG. 6), as well as with its power consumption when operated according to the method 400 described with reference to FIG. 4 (curve 606 in FIG. 6). As shown in FIG. 6, the method 400 described with reference to FIG. 4 effectively flattens the power consumption of the fan across its entire range of operation, while maintaining the 50 W power limitation and achieving the improved performance in the operation range exemplified by operating range segment 502 in FIG. 5.

In alternative examples, the methodology of FIG. 4 can be modified to cap power only where the fan's power consumption exceeds a desired threshold, (e.g., 50 W), but to allow normal operation of the fan at all other portions of fan operation. In FIG. 6, for example, power may be capped only in the range 608, where uncapped power consumption exceeds 50 W. In such examples, the resultant power consumption outside of range 608 would be identical to curve 602.

Figure 7:
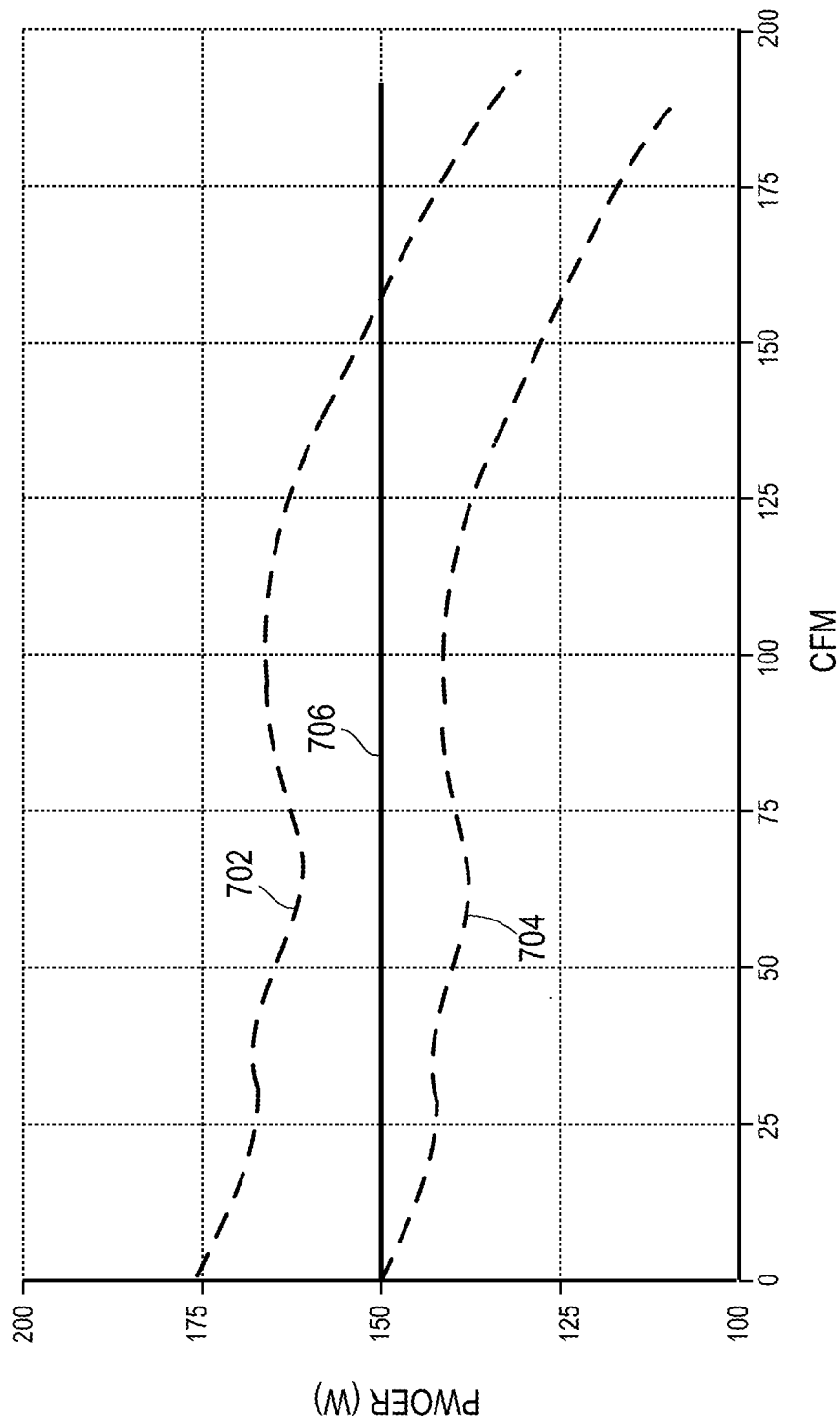
FIG. 7 is another plot of power consumption for a cooling fan comparing power consumption with an imposed power cap, without an imposed power cap, and when employing the method of FIG. 4.

FIG. 7 is a power consumption plot for another example fan, in particular, an 80 mm by 80 mm by 86 mm fan having a 175 W rating. In FIG. 7, power rating curve 702 reflects the nominal power rating and power consumption of the fan of zero to over 175 cubic feet per minute ("CFM") operation. Power rating curve 704, on the other hand, reflects power consumption for the fan when capped to a 150 W maximum. Curve 706 reflects the effective power rating of the fan of this example when operated according to the method 400 described herein with reference to FIG. 4.

Figure 8:
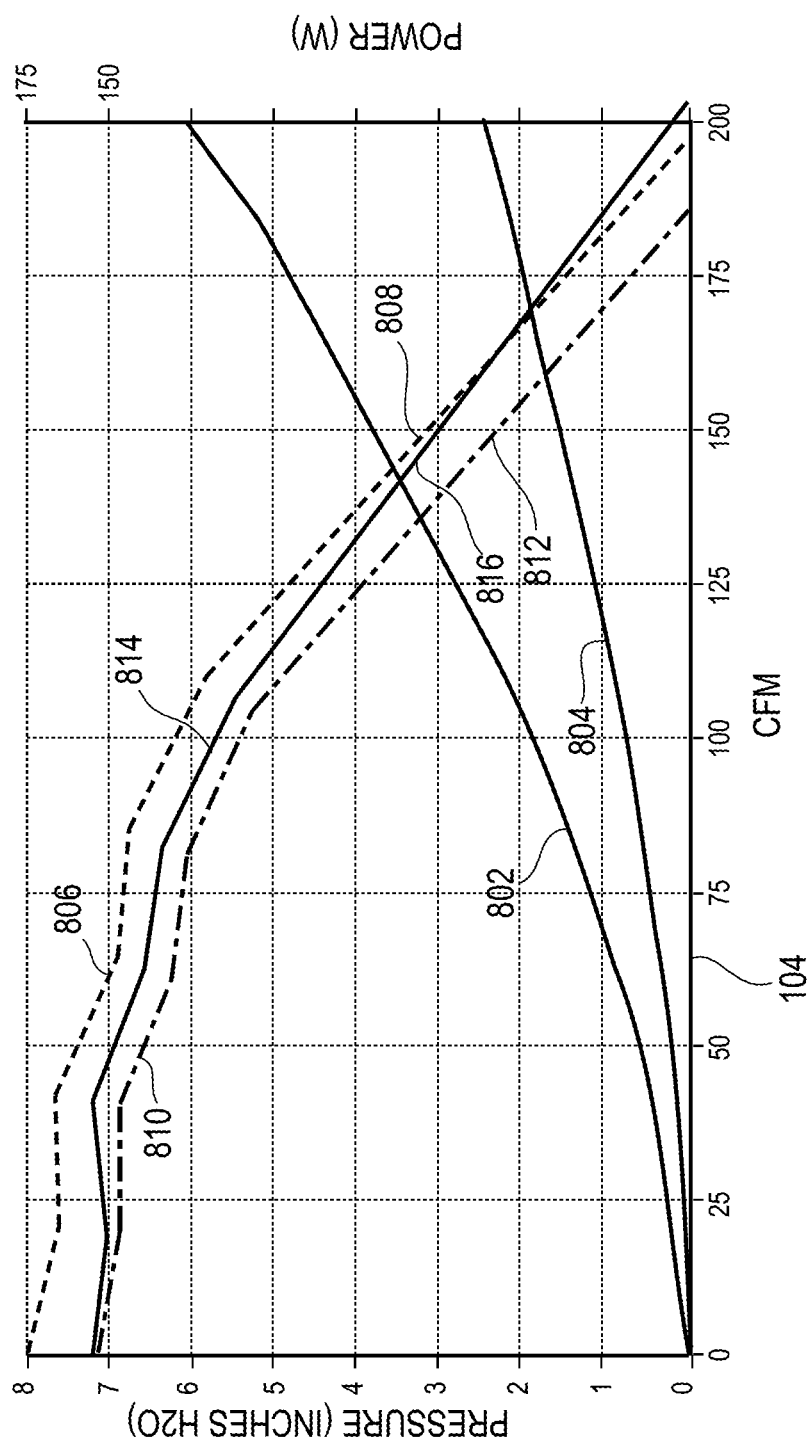
FIG. 8 is a plot of fan performance versus pressure and power comparing fan performance with an imposed power cap, without an imposed power cap, and when employing the method of FIG. 4.

Based on the power consumption plots of FIG. 7, FIG. 8 is a plot of the performance of the fan from FIG. 7 in an example compute system. In this example, a high air impedance curve 802 and a low air impedance curve 804 define the range of air impedance profiles for the example compute system. Fan curve 806 reflects operation of the fan with no power cap, i.e., with a maximum power of 175 W as described with reference to FIG. 7. Reference numeral 808 indicates the Operating range segment 808 of fan curve 806 is the segment of fan curve 806 between high air impedance curve 802 and low air impedance curve 804.

Fan curve 810 reflects operation of the fan with a power cap of 150 W, as also described with reference to FIG. 7. Operating range segment 812 of fan curve 810 is the segment of fan curve 810 between high air impedance curve 802 and low air impedance curve 804.

Finally, fan curve 814 in FIG. 8 reflects operation of the fan when operated according to the method 400 described herein with reference to FIG. 4. Operating range segment 816 of fan curve 814 is the segment of fan curve 814 between high air impedance curve 802 and low air impedance curve 804. As shown in FIG. 8, operating range segment 816 reflects substantially better performance in the operating range of the compute system as compared with the capped performance reflected by operating range segment 812 of capped fan curve 810.

Figure 9:
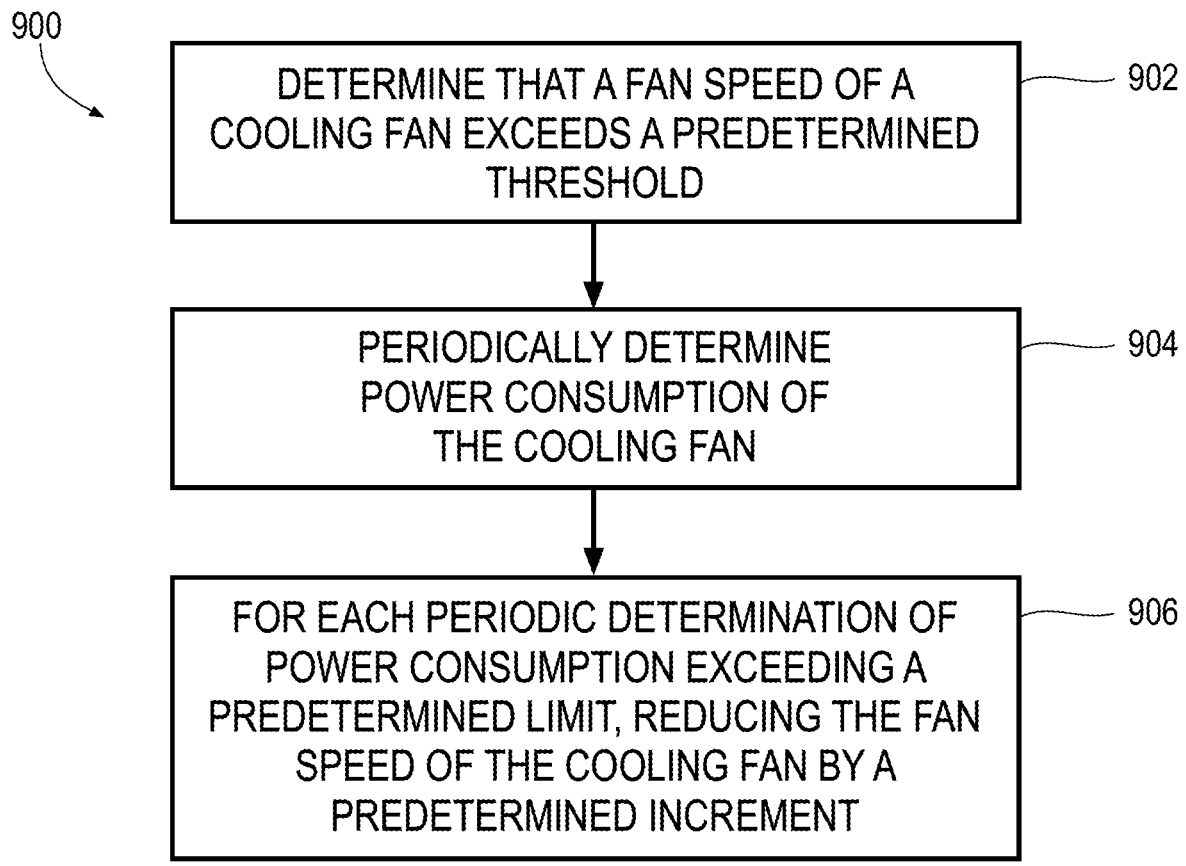
FIG. 9 is a flow diagram illustrating a method of operating a cooling fan according to one or more examples.

In accordance with the disclosure herein there have been shown examples of a method 900 as shown in FIG. 9 for operating a cooling fan of a compute device. As shown in FIG. 9, in some examples the method comprises, in block 902, determining that a fan speed of a cooling fan in a compute device exceeds a predetermined threshold.

Next, in block 904, the method includes periodically determining the power consumption of the cooling fan. As described above, this determination may be by estimating fan power consumption based upon fan characteristics and current fan speed, or may be made by measuring fan power consumption. As used herein, the term "periodically" does not necessarily imply a specific or regular interval, but only that the determination may be may at successive times.

In block 906, for each periodic determination of fan power, if the fan power consumption exceeds a predetermined threshold, the fan speed may be reduced by a predetermined increment. This increment may, in some examples, be a predetermined percentage of the fan speed, e.g., ten percent.

Figure 10:
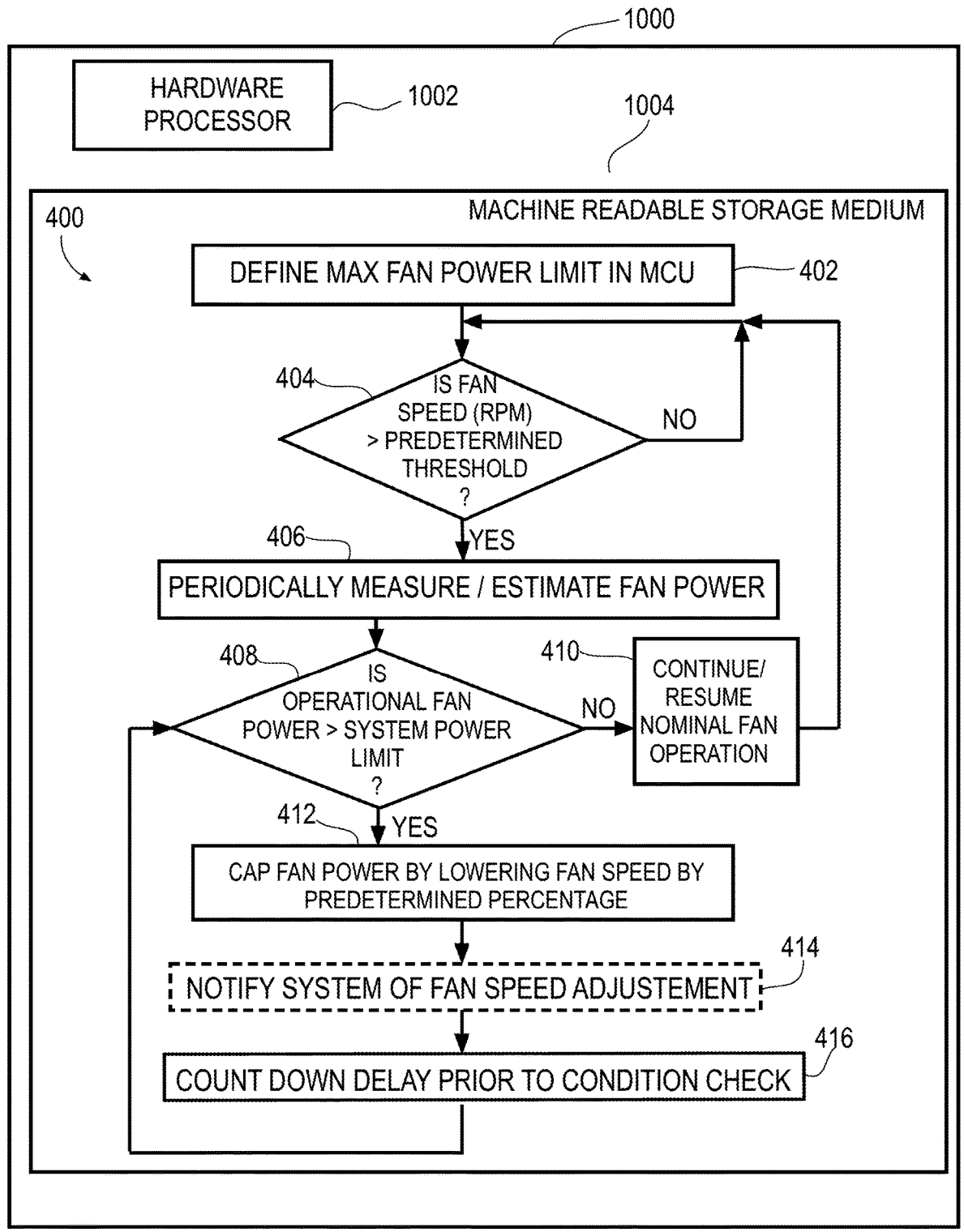
FIG. 10 is a block diagram of a computing resource implementing a method of operating a network system according to one or more examples.

FIG. 10 is a block diagram representing a computing resource 1000 implementing a method of controlling a cooling fan in a compute device according to one or more examples. Computing resource 1000 may include at least one hardware processor 1002 and a machine-readable storage medium 1004. As illustrated, machine readable medium 904 may store instructions, that when executed by hardware processor 1002 (either directly or via emulation/virtualization), cause hardware processor 1002 to perform the method 400 described above with reference to FIG. 4.

In various examples, hardware processor 1002 may be, for example and without limitation, a microcontroller, a central processing unit ("CPU"), a digital signal processor ("DSP"), a programmed logic array (PLA), or a custom processing circuit.

Examples in the present disclosure may be directed to a non-transitory computer-readable medium storing computer-executable instructions and executable by one or more processors of the computer via which the computer-readable medium is accessed. For instance, the memory 308 of FIG. 3 may be one such non-transitory readable medium. The memory 308 stores instructions executable by the processor 308 to perform the functionality attributed to the micro control unit 304 described above.

A computer-readable media may be any available media that may be accessed by a computer. By way of example, such computer-readable media may comprise random access memory ("RAM"), read-only memory ("ROM"), electrically-erasable/programmable read-only memory ("EEPROM"), compact disc ROM ("CD-ROM") or other optical disk storage, magnetic disk storage or other magnetic storage devices, or any other medium that may be used to carry or store desired program code in the form of instructions or data structures and that may be accessed by a computer. Disk and disc, as used herein, includes compact disc ("CD"), laser disc, optical disc, digital versatile disc ("DVD"), floppy disk and Blu-ray® disc where disks usually reproduce data magnetically, while discs reproduce data optically with lasers.

Note also that the software implemented aspects of the subject matter hereof are usually encoded on some form of program storage medium or implemented over some type of transmission medium. The program storage medium is a non-transitory medium and may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The claimed subject matter is not limited by these aspects of any given implementation.

The foregoing description, for purposes of explanation, uses specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. Examples herein are not intended to be exhaustive of or to limit this disclosure to the precise forms described. Many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A method of operating a cooling fan in a compute device, comprising:
   determining, in a micro control unit coupled to the compute device, that a fan speed of the cooling fan exceeds a predetermined speed threshold;
   in response to determining the fan speed exceeds the predetermined threshold, periodically determining power consumption of the cooling fan;
   for each periodic determination of power consumption of the cooling fan;
      in response to the periodic determination of power consumption of the cooling fan exceeding a predetermined power consumption limit for the cooling fan, reducing the fan speed of the cooling fan by a predetermined increment, wherein the predetermined power consumption limit for the cooling fan is less than a rated power consumption limit of the cooling fan.

2. The method of claim 1, wherein the predetermined speed threshold is 80% of a maximum speed of the cooling fan.

3. The method of claim 1, wherein periodically determining power consumption of the cooling fan comprises determining power consumption of the cooling fan every ten seconds.

4. The method of claim 1, further comprising:
   in response to reducing the fan speed of the cooling fan by the predetermined increment, issuing an alert to a system management module of the compute system.

5. The method of claim 1, wherein reducing the fan speed of the cooling fan by the predetermined increment comprises reducing the fan speed of the cooling fan by ten percent.

6. The method of claim 1, wherein:
   for each periodic determination of power consumption of the cooling fan:
      in response to the periodic determination of power consumption not exceeding the predetermined power consumption limit, discontinuing any prior reduction of fan speed.

7. The method of claim 1, wherein the periodic determination of power consumption comprises estimating a power consumption based on the speed of the fan.

8. The method of claim 1, wherein the periodically determining power consumption of the cooling fan is performed in response to determining that the fan speed of the cooling fan exceeds the predetermined speed threshold and is not performed otherwise.

9. A compute device, comprising:
   a cooling fan;
   a micro control unit coupled to the fan, the micro control unit programmed to:
      in response to a determination that a fan speed of the cooling fan is above a predetermined speed threshold, periodically determine a power consumption of the cooling fan; and
      in response to a periodic determination of the power consumption of the cooling fan exceeding a predetermined power consumption limit for the cooling fan, reduce the fan speed of the cooling fan by a predetermined increment, wherein the predetermined power consumption limit for the cooling fan is less than a rated power consumption limit of the cooling fan.

10. The compute device of claim 9, wherein the predetermined speed threshold is 80% of a maximum speed of the cooling fan.

11. The compute device of claim 9, wherein periodically determining power consumption of the cooling fan comprises determining power consumption of the cooling fan every ten seconds.

12. The compute device of claim 9, wherein the micro control unit is configured to, in response to reducing the fan speed of the cooling fan by a predetermined increment, issue an alert to a control circuit of the compute system.

13. The compute device of claim 9, wherein reducing the fan speed of the cooling fan by a predetermined increment comprises reducing the fan speed of the cooling fan by ten percent.

14. The compute device of claim 9, wherein:
   the micro control unit is configured to, for each periodic determination of power consumption of the cooling fan:
      in response to the periodic determination of power consumption not exceeding a predetermined power consumption limit, discontinue any prior reduction of fan speed.

15. The compute device of claim 9, wherein the periodic determination of power consumption comprises estimation of power consumption based on fan speed.

16. A non-transitory computer-readable medium, tangibly embodying instructions executable by a hardware processor to cause the hardware processor to:
   determine that a fan speed of a cooling fan in a compute device is above a predetermined speed threshold;
   in response to determining the fan speed exceeds the predetermined threshold, periodically determine power consumption of the cooling fan;
   for each periodic determination of power consumption of the cooling fan:
      in response to a periodic determination of power consumption of the cooling fan exceeding a predetermined power consumption limit for the cooling fan, reduce the fan speed of the cooling fan by a predetermined increment, wherein the predetermined power consumption limit for the cooling fan is less than a rated power consumption limit of the cooling fan.

17. The non-transitory computer-readable medium of claim 16, wherein the hardware processor is a micro control unit in the compute device.

18. The non-transitory computer-readable medium of claim 16, wherein the periodically determining power consumption of the cooling fan is performed in response to determining that the fan speed of the cooling fan exceeds the predetermined speed threshold and is not performed otherwise.

19. The non-transitory computer-readable medium of claim 16, wherein the instructions are executable by the hardware processor to cause the hardware processor to:
   in response to reducing the fan speed of the cooling fan by the predetermined increment, issuing an alert to a system management module of the compute system.

20. The non-transitory computer-readable medium of claim 16, wherein reducing the fan speed of the cooling fan by the predetermined increment comprises reducing the fan speed of the cooling fan by ten percent.

* * * * *